(12) United States Patent
Mutoh

(10) Patent No.: US 6,999,330 B2
(45) Date of Patent: Feb. 14, 2006

(54) POWER CONVERTER AND SYSTEM USING THE SAME

(75) Inventor: Nobuyoshi Mutoh, Tokyo (JP)

(73) Assignee: Keio University, Tokyo (JP)

( * ) Notice: Subject to any disclaimer, the term of this patent is extended or adjusted under 35 U.S.C. 154(b) by 0 days.

(21) Appl. No.: 10/960,291

(22) Filed: Oct. 8, 2004

(65) Prior Publication Data

US 2005/0174820 A1 Aug. 11, 2005

(30) Foreign Application Priority Data

Oct. 10, 2003 (JP) .......................... P. 2003-352460

(51) Int. Cl.
*H02M 1/00* (2006.01)

(52) U.S. Cl. .................................................. 363/144
(58) Field of Classification Search .................. 363/16, 363/34, 37, 40, 131, 144; 257/207, 691
See application file for complete search history.

(56) References Cited

U.S. PATENT DOCUMENTS 6,246,182 B1 *  6/2001  Yamasaki et al. ....... 315/209 R
6,344,667 B1 *  2/2002  Miyagi ....................... 257/207
6,396,721 B1 *  5/2002  Sonoda et al. ................ 363/98
6,429,701 B1 *  8/2002  Karaki et al. ................ 327/110
6,683,260 B1 *  1/2004  Shimamoto et al. ........ 174/268

FOREIGN PATENT DOCUMENTS

JP             3432505 B1     5/2003

* cited by examiner

*Primary Examiner*—Adolf Berhane
(74) *Attorney, Agent, or Firm*—Sughrue Mion, PLLC

(57) ABSTRACT

A second wiring layer 362 of a multilayer wiring board constituting a power converter is provided with a first positive side direct current wiring 311p and a second positive side direct current wiring 312p constituting a direct current bus 300p. The first positive side direct current wiring 311p and the second positive side direct current wiring 312p as well as a negative side direct current wiring are provided with a bent structure for making a transmission path length on one side in a direct current transmitting direction shorter than a transmission path length on other side thereof. Line widths of the first positive side direct current wiring 311p and the second positive side direct current wiring 312p are set to a width equal to or larger than a width by which a damping factor of a noise current in the direct current transmitting direction becomes substantially a constant value.

4 Claims, 9 Drawing Sheets

→ : COMMON MODE CURRENT
⋯▶ : NORMAL MODE CURRENT

POWER CONVERTER AND SYSTEM USING THE SAME

BACKGROUND OF THE INVENTION

The present invention relates to a power converter for carrying out a control by switching operation and a system using the same.

A power converter controlled by switching operation is used in various apparatus of motor driving apparatus or the like and a function requested thereto becomes severe. In order to meet the needs, a switching characteristic of a power element constituting a power converter is improved and a switching period is considerably accelerated to 10 ns through 100 ns. Therefore, a frequency of EMI (electromagnetic interference) noise generated from a system using a power converter is increased and is liable to invade other electronic apparatus, information communicating apparatus or the like as common mode noise via a stray capacitance and electromagnetic hazard is liable to generate.

A common mode current (leakage current) flowing in a motor driving system is made to flow via a stray capacitance distributed in the system in various states. In order to restrain the common mode current, a circuit model grasping a behavior of the common mode noise (voltage, current) of the driving system and reflecting the behavior becomes indispensable.

FIG. 11 is a diagram showing an outline constitution of a motor driving system which is an example of a system using a power converter controlled by switching operation. The motor driving system of FIG. 11 includes an alternating current power source 1, an AC reactor 2, a power converter 3, and a motor 4. Further, ground lines (not illustrated) of the AC reactor 2, a frame (not illustrated) of the motor 4 and the power converter 3 are connected to a ground 5. Further, here, the frame indicates a structural member supporting an apparatus covered with a total of the apparatus by a conductor in a state of being electrically insulated from a conductive portion of an apparatus.

The power converter 3 is supplied with a power source from the alternating current power source 1 via the AC reactor 2 to convert into a power source having an arbitrary frequency and an arbitrary voltage. The power converter 3 constitutes basic constituent elements by a converter (forward converter) 31 for converting the inputted alternating current power source into a direct current voltage, a smoothing capacitor 32 for smoothing the direct current voltage outputted from the converter 31, and an inverter (inverse converter) for converting the smoothed direct current voltage into an alternating current voltage, the elements are mounted to a wiring board 30, and the converter 31 and an inverter 33 are connected via direct current main circuit conductors (direct current buses) 300n, 300p formed at the wiring board 30. Further, an element case or the like constituting the converter 31 and the inverter 33 is attached with a cooling fin 34. The cooling fin 34 is for restraining temperature rise of the elements or the like and electrically connected to a ground (not illustrated in FIG. 11) of the wiring board 30.

There are two kinds of EMI noises in such a system. One of them is a normal mode noise (differential mode noise) generated by a differential voltage from the direct current main circuit conductors 300n, 300p between the converter 31 and the inverter 33 and other thereof is a common mode noise generated by the common mode current flowing via parasitic capacitances distributed in the motor driving system. The normal mode noise gives rise to the common mode noise and in order to reduce the EMI noise, it is important to control the normal mode noise.

As shown by FIG. 11, there are present three kinds of the common mode current of a current Ic 2 leaked from the element case or the like of the power converter 3 to the ground via the cooling fin 34, a current Ic 3 leaked to the ground via the frame of the AC reactor 2 and a current Ic 1 leaked via the motor frame. As shown by FIG. 11, the common mode current is made to flow via the stray capacitance and therefore, a noise component at a high frequency is made to flow as a leakage current. Further, in FIG. 11, notation with regard to the stray capacitance is omitted.

The inventors have proposed a technology of reducing a common mode current flowing via a stray capacitance distributed at inside of a system (refer to Nonpatent Reference 1, Patent Reference 1). According to the system, damping impedances are inserted between a single or a plurality of elements in elements constituting the system and the ground.

The normal mode noise can be restrained by inserting a noise filter to a direct current line between a converter and an inverter. However, there is a possibility of newly forming a current path inducing the common mode noise via an apparatus added for a countermeasure thereagainst and it is preferable to avoid an additional circuit for reducing the normal mode noise as less as possible.

The inventors have proposed also a technology of reducing the normal mode noise (refer to Nonpatent Reference 1, Patent Reference 1). According to the technology, direct current main circuit conductors between a converter and an inverter are arranged at wiring layers of a multilayer wiring board different from each other at symmetrical positions by interposing insulating layers therebetween.

FIG. 12 shows an outline constitution of an example of the wiring board 30 utilized in the power converter 3 shown in FIG. 11 (also similar to the power converter 3 shown in Nonpatent Reference 1). The wiring board 30 includes 4 layers of wiring layers from a first wiring layer (not illustrated) to a fourth wiring layer 364, and insulator layers 372 through 374 are arranged among the respective wiring layers and surfaces of the first wiring layer and the fourth wiring layer 364 (illustration of the insulator layers at the surface of the first wiring layer and between the first wiring layer and the second wiring layer 362 is omitted).

The first wiring layer (not illustrated) is a layer mainly provided with a gate circuit of the power converter 3, wirings for a voltage detector, a current detector, a wiring for transmission for supplying a power source and the like. The second wiring layer 362 is provided with a first positive side direct current wiring 301p and a second positive side direct current wiring 302p constituting the direct current bus 300p. The third wiring layer 363 is provided with a negative side direct current wiring 301n constituting the direct current bus 300n. Further, the first positive side direct current wiring 301p and the second positive side direct current wiring 302p are connected via an electromagnetic relay 35. When it is not necessary to cut conduction between the converter 31 and the inverter 33, the electromagnetic relay 35 can be omitted by constituting a single wiring by connecting the first positive side direct current wiring 301p and the second positive side direct current wiring 302p. Further, the fourth wiring layer 364 is a wiring layer formed with a ground wiring 304 constituting a ground face of the power converter 3. Further, only portions of the wiring board 30 at vicinities of wirings constituting the direct current paths 300p, 300n are shown in the wiring board 30 of FIG. 12.

The converter 31 and the inverter 33 constituted by IMP are respectively arranged at a converter arranging region 31S and an inverter arranging region 33S. Further, an output terminal of the converter 31 is connected to one end of the first positive side direct current wiring 301p and one end of the negative side direct current wiring 301n and an input terminal of the inverter 33 is connected to one end of the second positive side direct current wiring 302p and other end of the negative side direct current wiring 301n. Further, the smoothing capacitor 32 is connected to a middle point of the second positive side direct current wiring 302p and a middle point of the negative side direct current wiring 301n in correspondence therewith.

A differential mode voltage $\Delta V$ between the direct current paths 300p, 300n becomes $\Delta V=(Ls1+Ls2-2M)$ di1/dt=Leffdi1/dt when a self-inductance of direct current bus 300p is designated by notation Ls1, a self-inductance of the direct current bus 300n is designated by notation Ls2, a mutual inductance thereof is designated by notation M, an effective inductance thereof is designated by notation Leff and a current flowing in the direct current bus 300p is designated by notation i1. The voltage $\Delta V$ is reduced by reducing the effective inductance Leff, that is, by increasing the mutual inductance M.

According to the wiring board 30 of FIG. 12, the first positive side direct current wiring 301p and the second positive side direct current wiring 302p and the negative side direct current wiring 301n constituting the direct current buses 300p, 300n are provided with structures symmetrical with each other by interposing the insulator layer 372 and therefore, the mutual inductance M is increased and the differential mode voltage $\Delta V$ can be reduced. Therefore, the differential mode current is reduced and the common mode current accompanied thereby can also be reduced.

However, a current at a frequency bond equal to or higher than several MHz constituting a noise current is diffused and propagated at a surface of the conductor by a skin effect and therefore, in the case of a high frequency current flowing in the direct current buses 300p, 300n by switching operation of the power converter, not only a conducting EMI noise but also a radiating EMI noise pose a problem. Further, the elements constituting the power converter are constituted by three-dimensional structures and therefore, such a radiating noise is easily propagated via stray capacitances among the respective elements and a countermeasure thereagainst is becoming difficult. A concentrated constant filter of a background art cannot control an EMI noise diffused on a surface of a power transmission line.

[Nonpatent Reference 1]

Nobuyoshi Mutoh, Mitsukatsu Ogata, Kayhan Gulez, and Fumio Harashima "New methods to Suppress EMI Noises in the Motor Drive System", distributed in the "9th European Conference on Power Electronics and Applications" held at a Gratz, Austria on Aug. 27 through 29, 2001 in the form of CD-ROM (ISBN: 90-75815-06-9)

[Patent Reference 1]

Japanese Patent Publication No. 3432505

SUMMARY OF THE INVENTION

The invention is carried out in view of the above-described situation, and has an object thereof to reduce an EMI noise generated from a power converter controlled by switching operation by a simple constitution.

The invention is a power converter for carrying out a control by switching operation, the power converter including a converter for converting an alternating current into a direct current, an inverter for converting the direct current into an alternating current, direct current buses for connecting an output terminal of the converter and an input terminal of the inverter, a multilayer wiring board formed with the direct current buses, and a smoothing capacitor connected between the direct current buses, wherein a positive side bus and a negative side bus of the direct current bus are arranged at positions at which wiring layers of the multilayer wiring board contiguous to each other substantially overlap, the direct current bus is provided with a bent structure for making a transmission path length on one side in a direct current transmitting direction shorter than a transmission path length on other side thereof, a line width of the direct current bus is constituted by a width equal to or larger than a width by which a damping factor of a high frequency current in the direct current transmitting direction becomes substantially a constant value at least with regard to a portion in a predetermined range from the output terminal of the converter and a portion in a predetermined range from the input terminal of the inverter and the bent structure of the direct current bus diffuses the high frequency current generated by the switching operation to the one side of the direct current bus.

According to the invention, not only a conducting EMI noise but also a radiating EMI noise can simultaneously be restrained. Further, an EMI noise restraining effect is incorporated from a product design stage and therefore, an extra noise countermeasure part is dispensed with and even in a series of products, a uniform noise restraining effect can be achieved for all of the products.

The power converter of the invention includes a power converter wherein a thickness of an insulator layer of the multilayer wiring board interposed by the wiring layer formed with the positive side bus and the wiring layer formed with the negative side bus is a thickness equal to or smaller than a thickness by which the high frequency generated by the switching operation is diffused to sides of the positive side bus and the negative side bus opposed to each other.

According to the invention, there is provided a system using the power converter wherein the multilayer board includes an apparatus grounding wiring layer, and a damping impedance is connected between one or a plurality of elements constituting a system and a ground.

According to the invention, a parameter can be corrected to be proper easily in maintenance and therefore, the uniform noise restraining effect is achieved until ultimate life of the product. Further, since only the impedance is inserted therebetween, an existing system can also be dealt with easily without being influenced by a constructing state or condition.

The system of the invention includes a system wherein the damping impedance is provided with a value at a vicinity of rapidly reducing an effect of restricting a resonance current flowing between the elements and the ground.

According to the invention, rise of a potential of an element constituting the system (for example, a frame or the like) can be avoided and therefore, the EMI noise can be restrained while preventing electric shock.

DETAILED DESCRIPTION OF THE PREFERRED EMBODIMENTS

Figure 1:
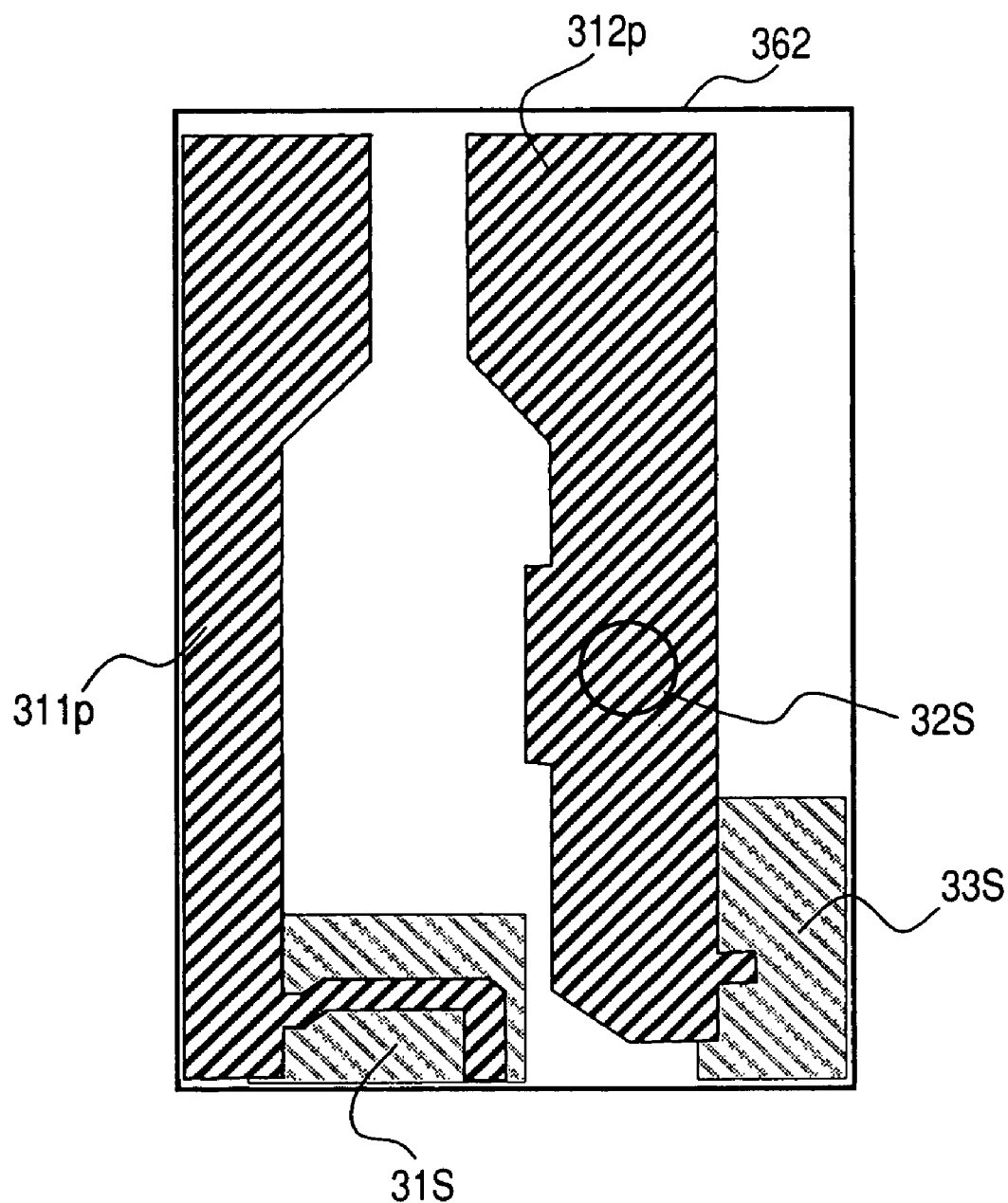
FIG. 1 is a view showing an outline constitution of an essential portion of a power converter according to an embodiment of the invention.

An explanation will be given of an embodiment of the invention in reference to the drawings as follows. FIG. 1 is a view showing an outline constitution of an essential portion of a power converter according to the embodiment of the invention, showing an outline constitution of the second wiring layer 362 of the multilayer wiring board constituting the power converter. The second wiring layer 362 is provided with the first positive side direct current wiring 311p and the second positive side direct current wiring 312p constituting the direct current bus 300p. One end of the first positive side direct current wiring 311p is outputted to the output terminal of the converter 31 (not illustrated in FIG. 1) arranged at the converter arranging region 31S, and one end of the second positive side direct current wiring 312p is outputted to the input terminal of the inverter 33 (not illustrated in FIG. 1) arranged at the inverter arranging region 33S. Other ends of the first positive side direct current wiring 311p and the second positive side direct current wiring 312p are connected by the electromagnetic relay 35 (not illustrated in FIG. 1). Further, the smoothing capacitor 32 (not illustrated in FIG. 1) is arranged at a capacitor arranging region 32S.

Figure 12:
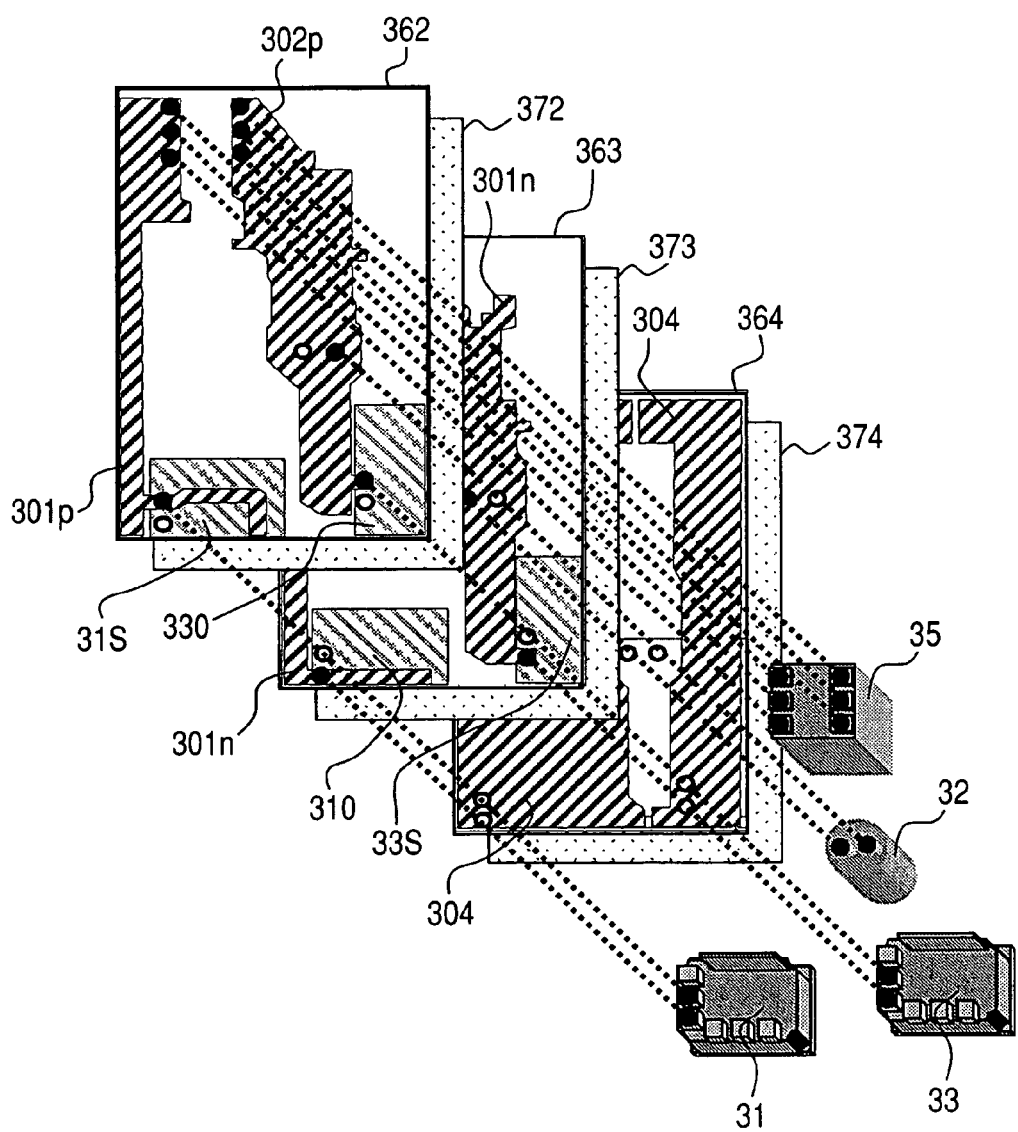
FIG. 12 is a view showing an outline constitution of an example of a wiring board utilized for a power converter.

The power converter includes the third wiring layer similar to that shown in FIG. 12, and the third wiring layer is provided with the negative side direct current wiring at positions substantially overlapping the first positive side direct wiring 311p and the second positive side direct current wiring 312p. The other constituent elements are basically similar to those shown in FIG. 12 and therefore, an explanation thereof will be omitted.

The first positive direct current wiring 311p and the second positive side direct current wiring 312p as well as the negative side direct current wiring, not illustrated, (hereinafter, there is also a case of describing the positive side direct current wiring and the negative side direct current wiring simply as direct current wirings) are provided with a bent structure for making a transmission path length on one side in a direct current transmitting direction shorter than a transmission path length on other side thereof. That is, a transmission path on a right side of illustration of the first positive side direct current wiring 311p becomes shorter than a transmission path on a left side, and a transmission path on a left side of illustration of the second positive side direct current wiring 312p becomes shorter than a transmission path on a right side. Therefore, the transmission path length on one side in the direct current transmitting direction becomes shorter than the transmission path length on other side, and there is brought about a difference between a resistance value on one side and a resistance value on other side. Therefore, a high frequency current (hereinafter, there is also a case that the high frequency current is described as noise current) generated by switching operation of the converter 31 or the inverter 33 is diffused to one side of the direct current bus. That is, at inside of the wiring layer of the direct current wiring, a noise current in a direction in parallel with the wiring layer (hereinafter, there is also a case in which the direction is described as a horizontal direction) is confined to one side.

Further, line widths of the first positive side direct current wiring 311p and the second positive side direct current wiring 312p are set to a width equal to or larger than a width by which a damping factor of the noise current in the direct current transmitting direction becomes substantially a constant value. Although as described later, the larger the line width of the board wiring, the larger the damping factor of the noise current propagated in the board wiring, when the line width is increased to some degree, the damping factor hardly changes. According to the invention, the line widths of the first positive side direct current wiring 311p and the second positive side direct current wiring 312p are made to be equal to or larger than such a line width at least with regard to portions in a predetermined range from the output terminal of the converter 31 and in a predetermined range from the input terminal of the inverter 33. Further, the "width by which the damping factor becomes substantially constant" does not strictly indicate the line width constituting a vicinity of a change rate of "0" but includes also a line width more or less narrower than the line width constituting a vicinity of the change rate of "0". The line width is increased for damping the noise current, when the line width becomes proximate to the line width by which the damping factor becomes substantially constant, the damping factor becomes proximate to a maximum damping factor provided by increasing the line width and therefore, even when a line width narrower than the above-described line width is constituted, such a line width contributes to a reduction in EMI noise. A similar line width is constituted also with regard to the negative side direct current wiring since the negative side direct current wiring is provided with a shape substantially overlapping the first positive side direct current wiring 311p and the second positive side direct current wiring 312p.

Figure 2A:
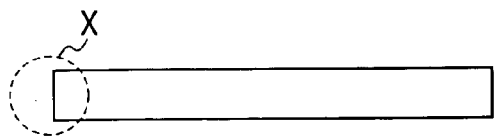
FIGS. 2A to 2D illustrate views for explaining an effect of confining a noise current.
Figure 2B:
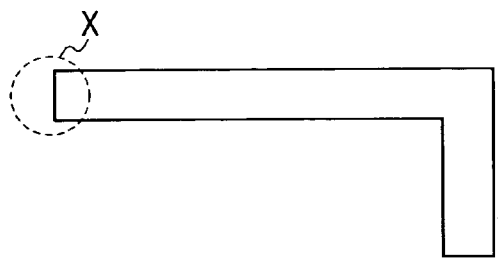
Figure 2C:
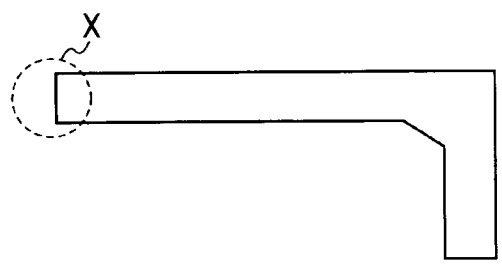
Figure 2D:
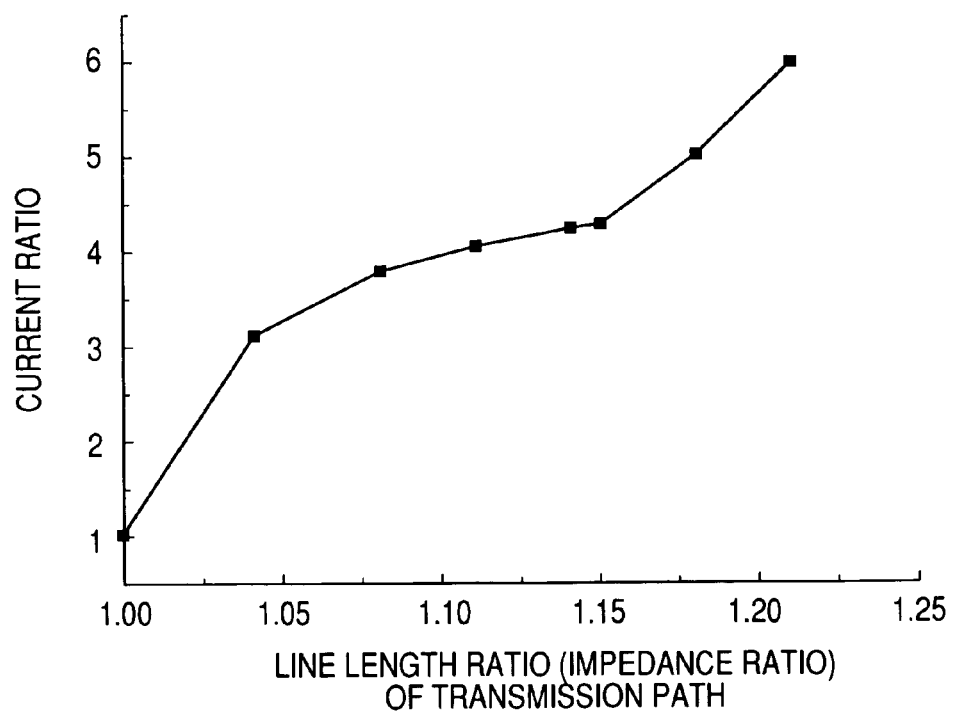

Next, an explanation will be given of the bent structure of the board wiring and confinement of the noise current. FIG. 2 illustrates views for explaining an effect of confining the noise current, showing a distribution of a high frequency current (of 15 MHz in this example) when an impulse voltage is applied to one ends of wirings having shapes shown in FIGS. 2A through 2C. FIG. 2D shows a ratio of high frequency currents as compared with the ratio of path lengths of transmission paths, that is, the ratio of impedances. Although when as shown by FIG. 2A, a ratio of path lengths of transmission paths (the ratio of a dimension on one side of a transmission path to a dimension on other side thereof) is equal to 1, the current ratio is also 1, when a bent structure is constituted as shown by FIG. 2B, a path length on a lower side becomes shorter a path length on an upper side of illustration and the path length ratio is increased. In this case, the high frequency current is diffused to a side of a short path length and therefore, the current ratio is increased. That is, the high frequency current in the horizontal direction is confined to one side of the transmission path. Further, when the path length ratio is increased by constituting a shape as shown by FIG. 2C, the current ratio can be increased.

In this way, the high frequency current constituting the EMI noise is confined and therefore, not only the conducting EMI noise but also the radiating EMI noise can simultaneously be restrained. In order to increase the confining effect, it is preferable to make the path length ratio as large as possible.

Next, an explanation will be given of confinement of the noise current in a vertical direction (a direction orthogonal to the wiring face). Although the high frequency current constituting the noise current is diffused at the surface of the wiring, according to the invention, the direct current buses 300p, 300n are arranged symmetrically by interposing the insulator layer (dielectric layer) 372 and therefore, the high frequency current is diffused to a side of the insulator layer 372. That is, the high frequency current is confined to the side of the insulator layer 372. Therefore, the radiating noise by the diffused high frequency current can be reduced. Confinement of the high frequency current to the insulator layer 372 is increased in accordance with an intensity of capacitance coupling of the direct current buses 300p and 300n and therefore, it is preferable to make the insulator layer 372 as thin as possible. Further, when the capacitance coupling of the direct current buses 300p and 300n is increased, the damping factor of the high frequency current in the direct current transmitting direction, mentioned later, is increased and the radiating noise can further be reduced.

Successively, an explanation will be given of the line widths of the direct current buses 300p, 300n. As described above, the capacitance coupling of the direct current buses 300p and 300n contributes to a reduction of the radiating noise when the capacitance coupling is large and therefore, it is preferable to increase the capacitance coupling by increasing the line width. Further, diffusion of the noise current of the direct current buses 300p, 300n in the direct current transmitting direction contributes to a reduction in the radiating noise when the diffusion is small.

Figure 3:
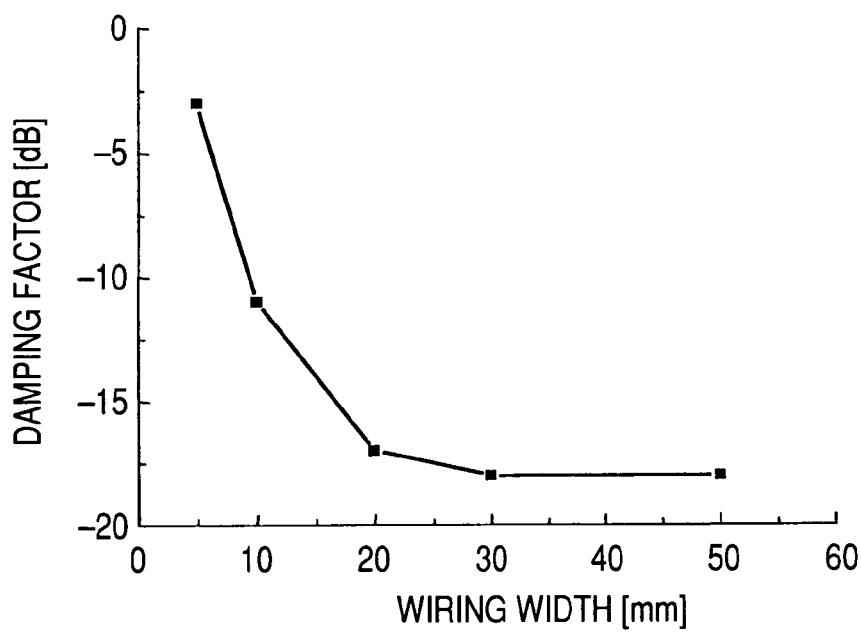
FIG. 3 is a diagram showing a relationship between a width of a wiring board and damping of a high frequency current.

FIG. 3 shows a relationship between the width of the board wiring and damping of the high frequency current. FIG. 3 shows to what degree the high frequency current of 15 MHz is damped at a position of being remote by 85 mm. The high frequency is rapidly damped until the wiring width reaches substantially 20 mm and is damped further until 30 mm, however, the damping factor becomes substantially constant when the wiring width becomes equal to or larger than 30 mm. This is because a diffusion component in the horizontal direction is reduced by increasing diffusion in the vertical direction at a vicinity of a high frequency source. That is, because the capacitance coupling is increased by increasing the wiring width at the vicinity of the high frequency source. In the case of the high frequency current of 15 MHz, substantially the maximum damping factor is provided by the line width of about 20 mm and therefore, when noise of such a frequency is assumed, by making the line width of the board wiring equal to or larger than 20 mm, the EMI noise can be reduced. Further, as is apparent from FIG. 3, the damping factor of the high frequency current is rapidly reduced until the line width reaches about 20 mm and even when the line width is narrower than 20 mm to some degree, the large damping factor is constituted. Therefore, even when the line width of the board wiring is narrower than 20 mm, in this example, about 20 mm, damping equal to or larger than 10 dB is provided and therefore, a sufficient effect of reducing the EMI noise can be expected. That is, the line width equal to or larger than the line width by which the damping factor of the high frequency current becomes substantially the constant value includes also a line width which is narrower than the line width of the vicinity of the line width by which the damping factor of the high frequency current becomes substantially the constant value and a line width by which the damping factor is increased to some degree.

As described above, by pertinently designing the shapes and the widths of the wirings constituting the direct current buses 300p, 300n, a range of diffusing the noise current and an amount of diffusing the noise current from the surface can be reduced and therefore, not only the conducting EMI noise but also the radiating EMI noise can be reduced.

Figure 4:
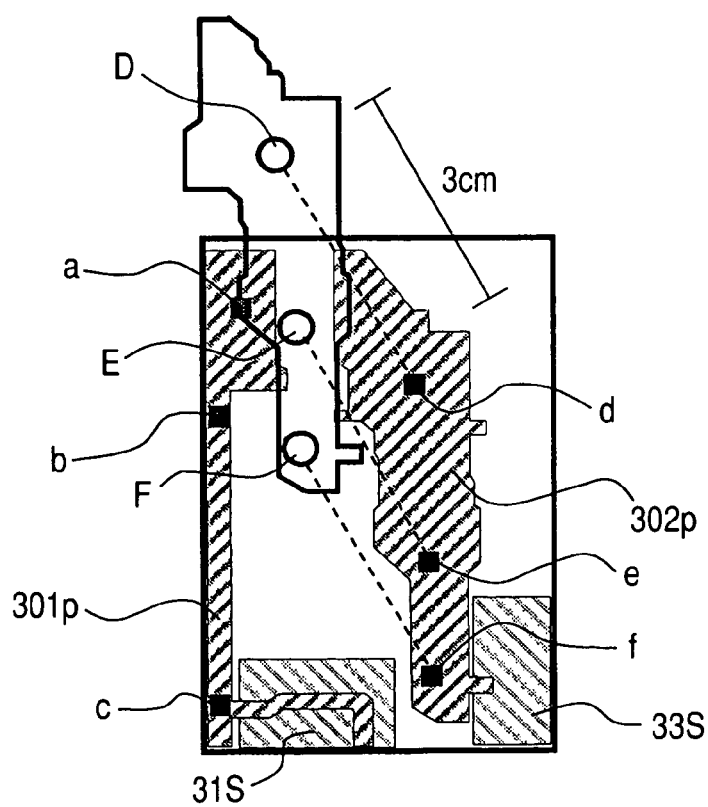
FIG. 4 is a view schematically showing an essential portion, a current measuring point and a magnetic field measuring point of a wiring board.

An explanation will be given of the shapes and the widths of the wirings constituting the direct current buses 300p, 300n and a magnitude of the EMI noise in reference to FIG. 4 through FIG. 7. FIG. 4 is a view schematically showing an essential portion, current measuring points and magnetic field measuring points of the wiring board of FIG. 12. Points a through f are the current measuring points of the first positive side direct current wiring 301p and the second positive side direct current wiring 302p, points D through F are points 3 cm above the wiring board 30 for measuring a proximate magnetic field.

Figure 5:
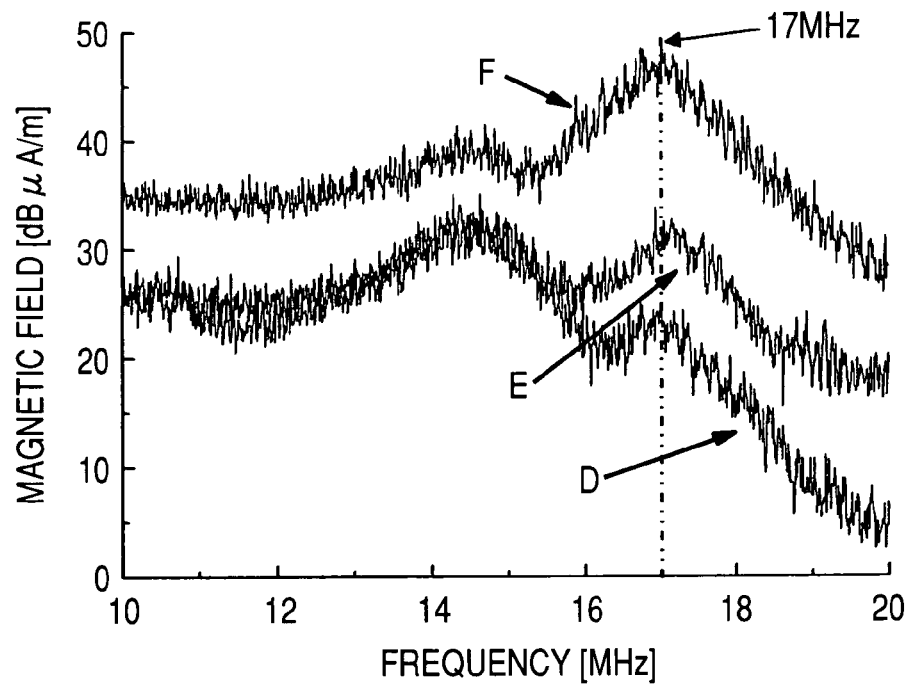
FIG. 5 is a diagram showing an intensity of a proximate magnetic field above a second positive side direct current wiring.

FIG. 5 is a diagram showing an intensity of a proximate magnetic field 3 cm above the second positive side direct current wiring 302p having the wiring width equal to or larger than 30 mm. As is apparent from the diagram, it is known that in a high frequency region including a resonance frequency (17 MHz) based on switching of the inverter 33, the magnetic field is considerably damped as being remote from a point of being connected to the inverter 33 constituting a noise source.

Figure 6:
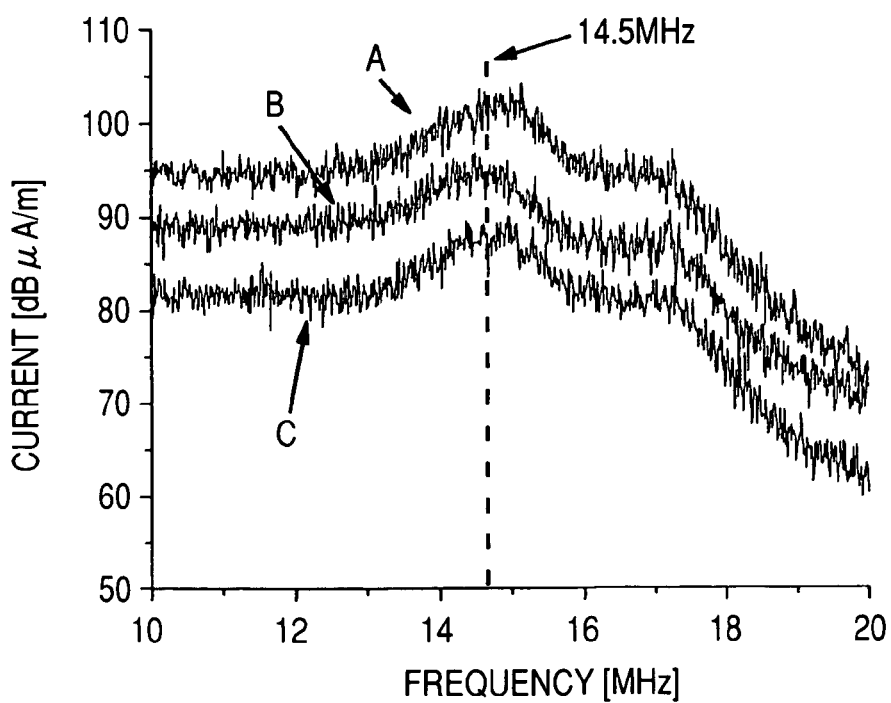
FIG. 6 is a diagram showing currents at a plurality of points of a first positive side direct current wiring.

FIG. 6 is a diagram showing currents at a plurality of points of the first positive side direct current wiring 301p having the width equal to or smaller than 20 mm from the point of being connected to the converter 31 constituting the noise source. As is apparent from the diagram, even when the point becomes remote from the point of being connected to the converter 31, the high frequency current is not damped.

Figure 7:
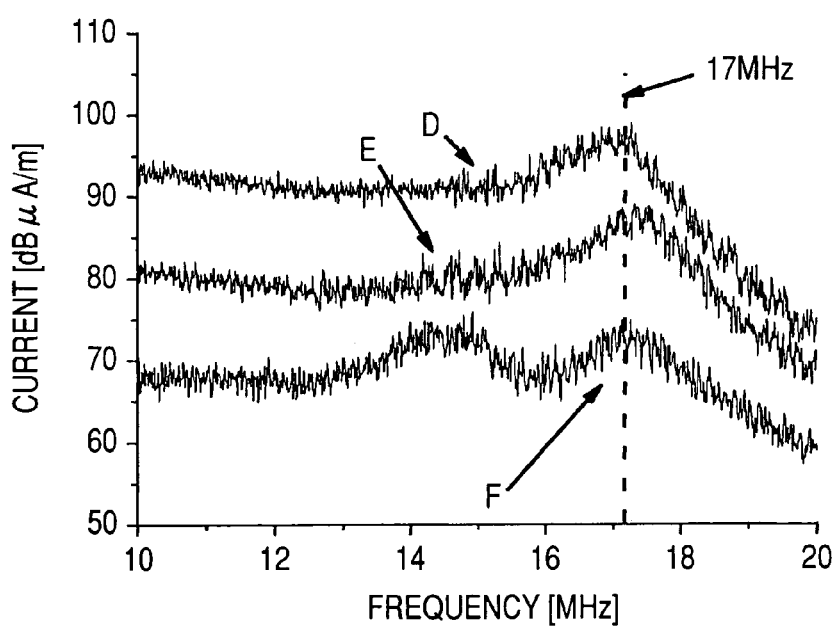
FIG. 7 is a diagram showing currents at a plurality of points of the second positive side direct current wiring.

FIG. 7 is a diagram showing currents at a plurality of points of the second positive side direct current wiring 302p having the width equal to or larger than 30 mm from the point of being connected to the inverter 33 constituting the noise source. As is apparent from the diagram, it is known that the high frequency current is considerably damped as being remote from the point of being connected to the converter 33.

As is apparent from the above-described experimental result, by selecting the shapes and the width of the wirings constituting the direct current buses 300p, 300n, not only the conducting EMI noise but also the radiating EMI noise can be reduced.

Further, although according to the direct current wiring shown in FIG. 1, the line width of a total of the wiring is constituted by the width equal to or larger than the width by which the damping factor of the noise current in the direct current transmitting direction becomes substantially the constant value, with regard to a portion of exceeding a predetermined range from the output terminal of the converter 31 and a portion exceeding a predetermined range from the input terminal of the inverter 33, such a line width may not be constituted. That is, at the positions remote from the converter 31 and the inverter 33 constituting the noise sources in the predetermined ranges, the noise current is sufficiently damped and therefore, even when the line width of the wiring is narrowed, influence with regard to the EMI noise is inconsiderable.

Figure 8:
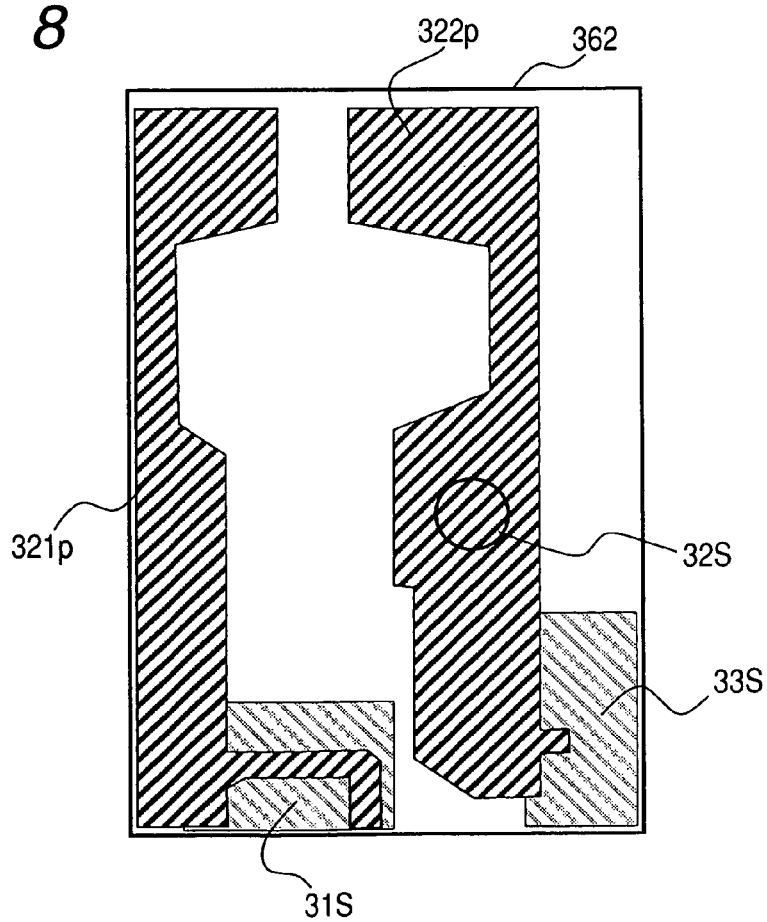
FIG. 8 is a view showing an outline constitution of an essential portion of a power converter according to other embodiment of the invention.

FIG. 8 shows an outline constitution of an essential portion of a power converter according to other embodiment of the invention. An outline constitution of the second wiring layer 362 of the multilayer wiring board constituting the power converter is shown similar to FIG. 1, and the same elements are attached with the same numerals. According to a first positive side direct wiring current 321p, with regard to a predetermined range from the output terminal of the converter 31, the line width is set to the width equal to or larger than the width by which the damping factor of the noise current in the direct current transmitting direction becomes substantially the constant value and with regard to the portion exceeding the range, the line width is set to a line width narrower than the above-described line width. Similarly, also a line width of the second positive side direct current wiring 322p is set to a width equal to or lager than a width by which the damping factor of the noise current in the direct current transmitting direction becomes substantially a constant value with regard to a predetermined range from the output terminal of the converter 33 and set to a line width narrower than the above-described line width with regard to a portion exceeding the range. When such a shape and a width of the wiring are constituted, the EMI noise can be reduced and further, an allowance can be constituted for a wiring space of the wiring board 30 and wiring design is facilitated.

The predetermined range of setting the direct current wiring to the width equal to or larger than the width by which the damping factor of the noise current in the direct current transmitting direction becomes substantially the constant value is sufficiently constituted by a range by which the damping factor of the noise current becomes substantially the constant value. Although in FIG. 8, since the first positive side direct current wiring 321p and the second positive side direct current wiring 322p are connected by the electromagnetic relay 35, line widths thereof at the portions are widened, when the electromagnetic relay 35 is omitted, also the line widths of the portions can be narrowed.

Figure 9:
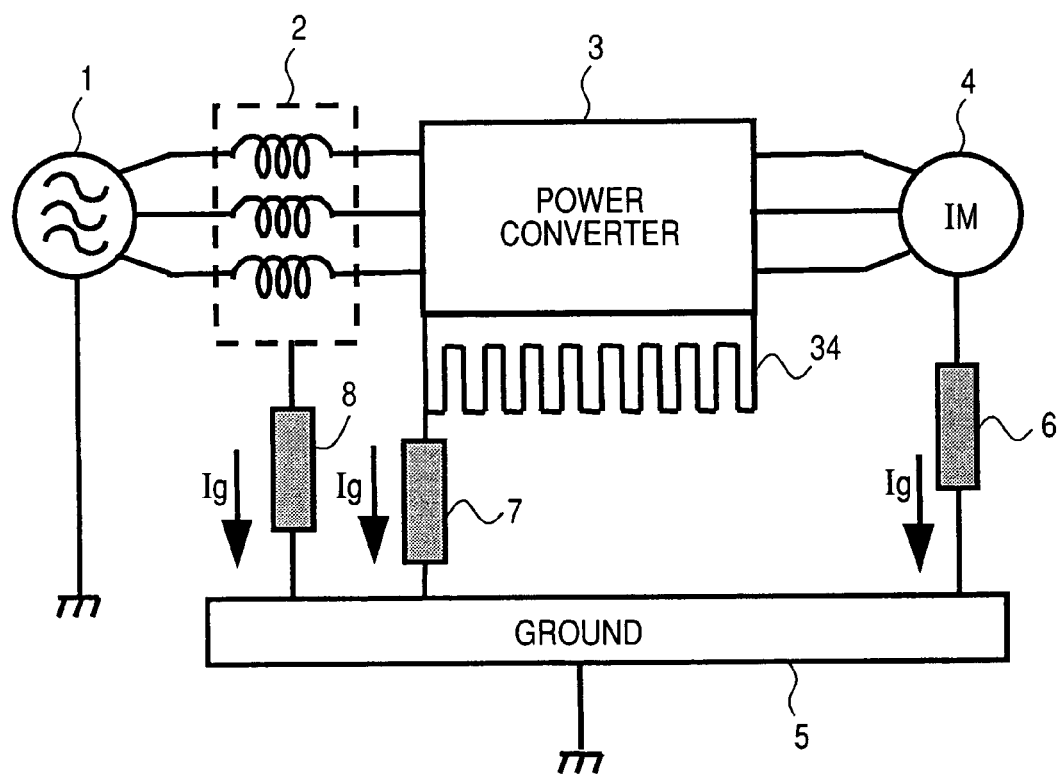
FIG. 9 is a view showing an outline constitution of a system for restraining an EMI noise by a damping impedance.

A portion of the high frequency current confined by selecting the shapes and the widths of the wirings constituting the direct current buses 300p, 300n is made to flow to the ground of the power converter 3 via the ground wiring 304 formed at the fourth wiring layer 364 of the board 30. Further, there are also currents flowing to the motor 4 and the AC reactor 2 via alternating current wirings. The currents are restrained by a method shown in Patent Reference 1. That is, as shown by FIG. 9, damping impedances 6, 7, 8 are inserted between the frame of the AC reactor 2, the cooling fin 34 of the power converter 3 and the frame of the motor 4 and the ground. However, all of the damping impedances 6, 7, 8 are not necessarily needed but only the damping impedance 6 or the damping impedances 6 and 7 may be inserted therebetween.

Figure 10:
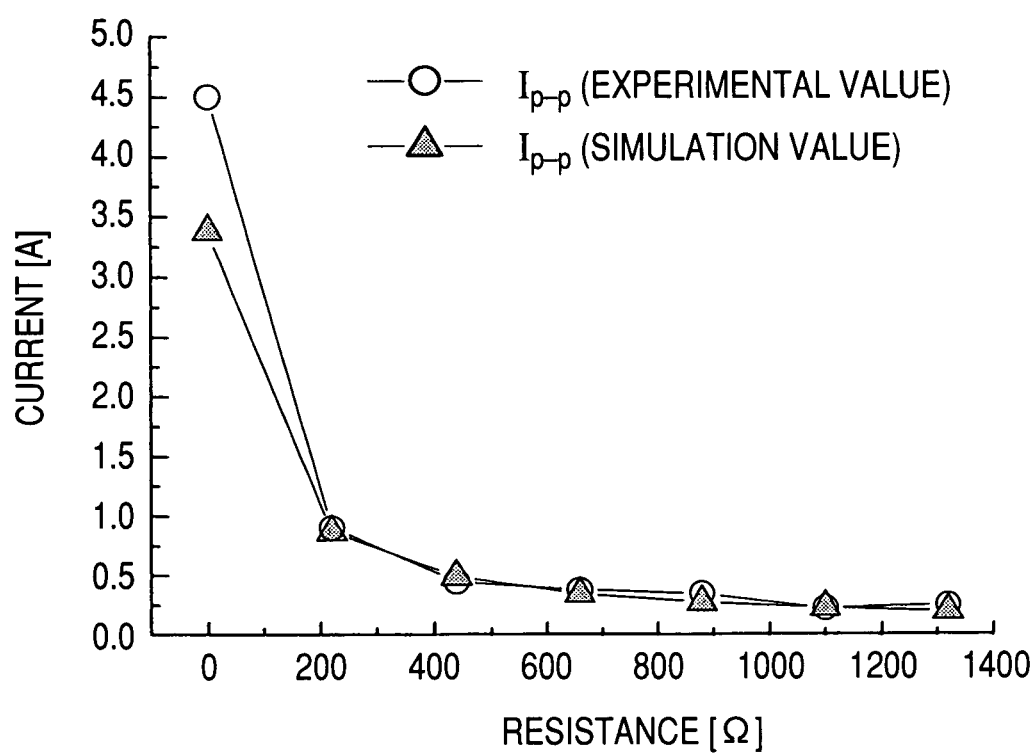
FIG. 10 is a diagram showing an example of a relationship between a value of the damping impedance inserted between a frame of a motor and a ground and a peak value of a common mode current flowing via the frame.
Figure 11:
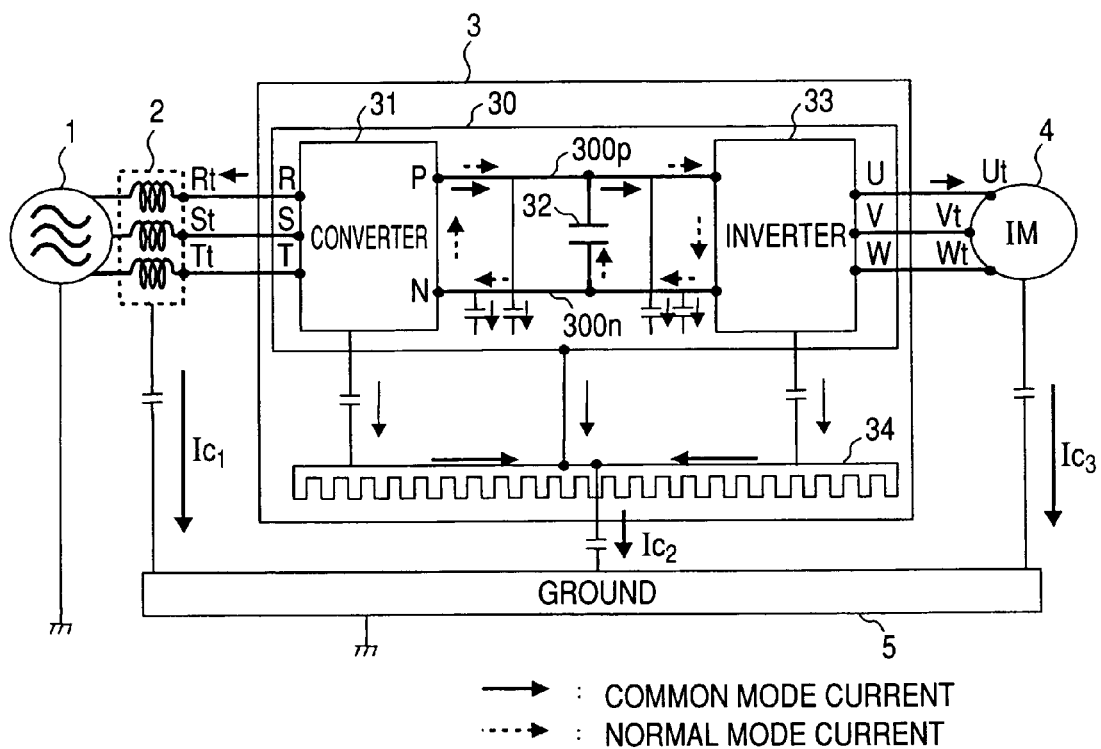
FIG. 11 is a view showing an outline constitution of a motor driving system.

Next, a description will be given of a value of the damping impedance to be inserted. FIG. 10 is a diagram showing a relationship between a value of the damping impedance 6 inserted between the frame (not illustrated) of the motor 4 and the ground 5 and a peak value of the common mode current flowing via the frame. In FIG. 10, a circular mark indicates a measured value and a triangular mark indicates a simulation value. As is apparent from the diagram, as increasing the impedance value, the common mode current is rapidly reduced and is gradually reduced later. The damping impedance restrains the resonance current flowing between the frame and the ground. It is preferable to set the value of the damping impedance to a value of a vicinity of rapidly reducing a resonance restraining effect, a vicinity of 200 Ω according to the example of FIG. 10. By selecting a minimum value of the value having the resonance restraining effect, it is avoided that a potential of an element connected with the damping impedance such as the frame of the motor or the like rises unnecessarily and safety of the apparatus can be promoted.

As is apparent from the above-described explanation, according to the invention, the EMI noise generated from the power converter controlled by the switching operation can be reduced by the simple constitution.

What is claimed is:

1. A power converter for carrying out a control by switching operation, comprising:
   a converter for converting an alternating current into a direct current;
   an inverter for converting the direct current into an alternating current;
   direct current buses for connecting an output terminal of the converter and an input terminal of the inverter;
   a multilayer wiring board formed with the direct current buses; and
   a smoothing capacitor connected between the direct current buses, wherein
   a positive side bus and a negative side bus of the direct current bus are arranged at positions at which wiring layers of the multilayer wiring board contiguous to each other substantially overlap;
   the direct current bus has a bent structure for making a transmission path length on one side in a direct current transmitting direction shorter than a transmission path length on other side thereof;
   a line width of the direct current bus is constituted by a width equal to or larger than a width by which a damping factor of a high frequency current in the direct current transmitting direction becomes substantially a constant value at least with regard to a portion in a predetermined range from the output terminal of the converter and a portion in a predetermined range from the input terminal of the inverter; and
   the bent structure of the direct current bus diffuses the high frequency current generated by the switching operation to the one side of the direct current bus.

2. The power converter according to claim 1, wherein a thickness of an insulator layer of the multilayer wiring board interposed by the wiring layer formed with the positive side bus and the wiring layer formed with the negative side bus is a thickness equal to or smaller than a thickness by which the high frequency generated by the switching operation is diffused to sides of the positive side bus and the negative side bus opposed to each other.

3. The system using the power converter according to claim 1, wherein
   the multilayer board includes an apparatus grounding wiring layer, and
   a damping impedance is connected between one or a plurality of elements constituting the system and a ground.

4. The system according to claim 3, wherein
   the damping impedance is provided with a value at a vicinity of rapidly reducing an effect of restricting a resonance current flowing between the elements and the ground.

* * * * *